(12) United States Patent
Khakifirooz et al.

(10) Patent No.: US 8,841,185 B2
(45) Date of Patent: Sep. 23, 2014

(54) HIGH DENSITY BULK FIN CAPACITOR

(75) Inventors: Ali Khakifirooz, San Jose, CA (US);
Thomas N. Adam, Albany, NY (US);
Kangguo Cheng, Schnectady, NY (US);
Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 74 days.

(21) Appl. No.: 13/584,176

(22) Filed: Aug. 13, 2012

(65) Prior Publication Data

US 2014/0042547 A1 Feb. 13, 2014

(51) Int. Cl.
*H01L 21/8242* (2006.01)
*H01L 29/94* (2006.01)

(52) U.S. Cl.
USPC .......................................... 438/253; 257/308

(58) Field of Classification Search
USPC ............ 438/157, 253, 266, 396; 257/306–316
See application file for complete search history.

(56) References Cited

U.S. PATENT DOCUMENTS

| 6,083,790 | A | 7/2000 | Lin et al. |
| 7,329,580 | B2 * | 2/2008 | Choi et al. ..................... 438/257 |
| 7,683,417 | B2 | 3/2010 | Xiong et al. |
| 7,696,040 | B2 | 4/2010 | Zhu |
| 8,420,476 | B2 * | 4/2013 | Booth, Jr. et al. ............. 438/210 |
| 2008/0296648 | A1 | 12/2008 | Zhu |
| 2009/0090949 | A1 * | 4/2009 | Mikasa ........................ 257/296 |
| 2009/0096003 | A1 | 4/2009 | Zhu |
| 2011/0291166 | A1 | 12/2011 | Booth, Jr. et al. |
| 2011/0298025 | A1 | 12/2011 | Haensch et al. |
| 2012/0061740 | A1 | 3/2012 | Torek et al. |
| 2012/0088349 | A1 | 4/2012 | Tang et al. |
| 2012/0104475 | A1 | 5/2012 | Anderson et al. |

FOREIGN PATENT DOCUMENTS

JP 2011014753 1/2011

* cited by examiner

*Primary Examiner* — Calvin Lee
(74) *Attorney, Agent, or Firm* — Joseph P. Abate; Howard M. Cohn (57) ABSTRACT

A high density bulk fin capacitor is disclosed. Fin capacitors are formed near finFETs by further etching the fin capacitors to provide more surface area, resulting in increased capacitance density. Embodiments of the present invention include depletion-mode varactors and inversion-mode varactors.

20 Claims, 14 Drawing Sheets

HIGH DENSITY BULK FIN CAPACITOR

FIELD OF THE INVENTION

The present invention relates generally to semiconductors, and more particularly, to methods and structures for bulk fin capacitors.

BACKGROUND OF THE INVENTION

Transistors, such as metal oxide semiconductor field-effect transistors (MOSFETs), are the core building block of the vast majority of semiconductor devices. Some semiconductor devices, such as high performance processor devices, can include millions of transistors. For such devices, decreasing transistors size, and thus increasing transistor density, has traditionally been a high priority in the semiconductor manufacturing industry.

FinFET technology is becoming more prevalent as device size continues to shrink. In addition to transistors, other devices, including capacitors, are required to implement various integrated circuit (IC) designs. It is therefore desirable to have a structure and fabrication process for forming capacitors that is compatible with the formation of FinFET structures.

SUMMARY OF THE INVENTION

In one embodiment, a semiconductor structure is provided. The semiconductor structure comprises a semiconductor substrate, a first set of fins disposed on a first well disposed within the semiconductor substrate, a second set of fins disposed on a second well disposed within the semiconductor substrate, an insulator layer disposed on the semiconductor substrate, wherein the second set of fins is partially embedded in the insulator layer and the first set of fins is outside of the insulator layer, a first dielectric layer disposed over the first set of fins, a second dielectric layer disposed over the second set of fins, a first gate region disposed over the first set of fins, and a second gate region disposed over the second set of fins.

In another embodiment, a semiconductor structure is provided. This semiconductor structure comprises a semiconductor substrate, a first set of fins disposed on a first well disposed within the semiconductor substrate, a second set of fins disposed on a second well disposed within the semiconductor substrate, an insulator layer disposed on the semiconductor substrate, wherein the second set of fins is embedded deeper into in the insulator layer than the first set of fins, a first dielectric layer disposed over the first set of fins, a second dielectric layer disposed over the second set of fins, a first gate region disposed over the first set of fins, and a second gate region disposed over the second set of fins.

In another embodiment, a method of making a fin capacitor is provided. The method comprises forming a first doped well in a semiconductor substrate, forming a second doped well in a semiconductor substrate, forming a first group of fins on the first doped well, forming a second group of fins on the second doped well, depositing an insulator layer on the first group of fins and the second group of fins, removing a portion of the insulator layer from the first group of fins, and doping the first group of fins.

In another embodiment, a design process is provided. The design process includes inputting a design file representing a circuit design embodied in a non-transitory computer-readable medium, using a computer to translate the circuit design into a netlist, wherein the netlist comprises a representation of a plurality of wires, transistors, and logic gates, and wherein the netlist is stored in the non-transitory computer-readable medium; and when executed by the computer, produces the circuit design. The circuit design comprises a semiconductor substrate, a first set of fins disposed on a first well disposed within the semiconductor substrate, a second set of fins disposed on a second well disposed within the semiconductor substrate, an insulator layer disposed on the semiconductor substrate, wherein the second set of fins is partially embedded in the insulator layer and the first set of fins is outside of the insulator layer, a first dielectric layer disposed over the first set of fins, a second dielectric layer disposed over the second set of fins, a first gate region disposed over the first set of fins, and a second gate region disposed over the second set of fins.

In another embodiment, a design process is provided. The design process includes inputting a design file representing a circuit design embodied in a non-transitory computer-readable medium, using a computer to translate the circuit design into a netlist, wherein the netlist comprises a representation of a plurality of wires, transistors, and logic gates, and wherein the netlist is stored in the non-transitory computer-readable medium; and when executed by the computer, produces the circuit design. The circuit design comprises a semiconductor substrate, a first set of fins disposed on a first well disposed within the semiconductor substrate, a second set of fins disposed on a second well disposed within the semiconductor substrate, an insulator layer disposed on the semiconductor substrate, wherein the second set of fins is embedded deeper into in the insulator layer than the first set of fins, a first dielectric layer disposed over the first set of fins, a second dielectric layer disposed over the second set of fins, a first gate region disposed over the first set of fins, and a second gate region disposed over the second set of fins.

BRIEF DESCRIPTION OF THE DRAWINGS

The structure, operation, and advantages of the present invention will become further apparent upon consideration of the following description taken in conjunction with the accompanying figures (FIGs.). The figures are intended to be illustrative, not limiting.

Certain elements in some of the figures may be omitted, or illustrated not-to-scale, for illustrative clarity. In some cases, in particular pertaining to signals, a signal name may be oriented very close to a signal line without a lead line to refer to a particular signal, for illustrative clarity.

Often, similar elements may be referred to by similar numbers in various figures (FIGs) of the drawing, in which case typically the last two significant digits may be the same, the most significant digit being the number of the drawing figure (FIG). Furthermore, for clarity, some reference numbers may be omitted in certain drawings.

DETAILED DESCRIPTION

Figure 1:
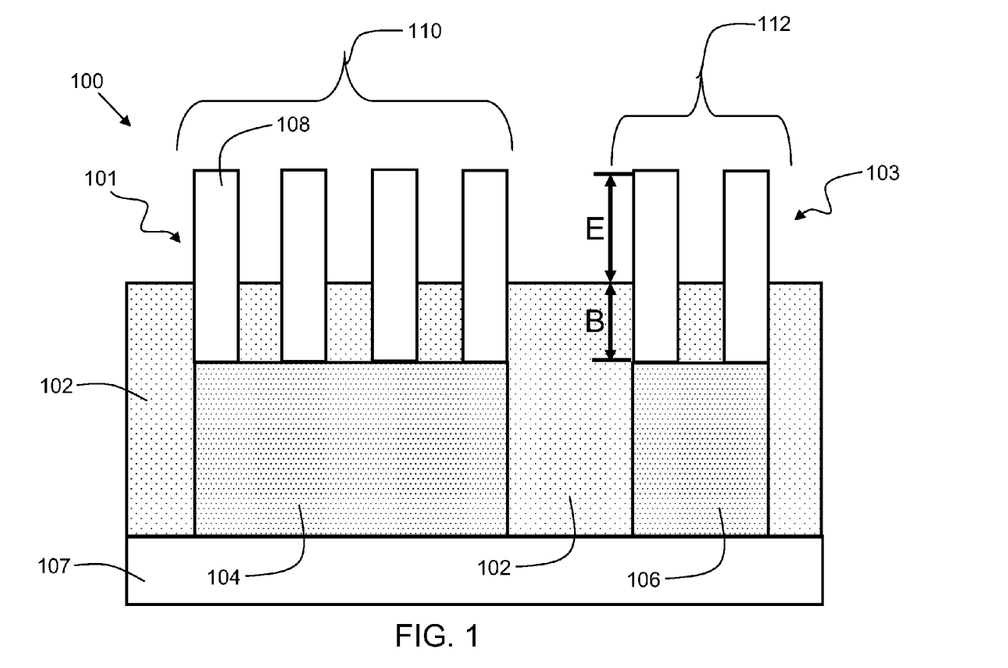
FIG. 1 is a view of a semiconductor structure at a starting point for a method in accordance with an embodiment of the present invention.

FIG. 1 is a view of a semiconductor structure 100 at a starting point for a method in accordance with an embodiment of the present invention. Semiconductor structure 100 comprises a fin capacitor 101 and a finFET 103. The fin capacitor 101 is comprised of a first group of fins 110 and the finFET 103 is comprised of a second group of fins 112. An individual fin from the first group of fins 110 is indicated generally as reference 108. Fins 110 are disposed on silicon well 104. Fins 112 are disposed on silicon well 106.

The wells 104 and 106 are doped regions of a semiconductor substrate 107. The semiconductor substrate 107 may be comprised of silicon. The wells 104 and 106 may be doped with N or P type dopants. In some embodiments, the wells 104 and 106 are "lightly doped" with a dopant concentration ranging from about 1E17 to about 1E18 atoms per cubic centimeter.

An insulator layer 102 is disposed on the semiconductor substrate 107 and wells 104 and 106. The fins are partially buried in the insulator layer. For each fin, there is a buried portion "B" and an exposed portion "E."

Typically, for a finFET, the exposed fin ratio E/(B+E) ranges from about 0.08 to about 0.25, meaning that a majority of the fin is buried (not exposed). This is because, it is difficult to pattern the gate structure of transistor with high aspect ratio, i.e. small gate length wrapping around a tall fin. Also, in a transistor, the bottom portion of the fin needs to be heavily doped (known as a punchtrough stopper implant) to suppress the leakage pass and cannot be used as a part of the channel. However, for a fin capacitor, which is a two terminal device with no lateral conduction, there is no need to have the punchthrough stopper implant and so the exposed fin ratio can be increased. Also, capacitors are often made significantly larger than the minimum gate length used in the transistors and hence, unlike the transistors, patterning of a capacitor structure with large topography is not difficult. Embodiments of the present invention provide for a fin capacitor with an increased exposed fin ratio. Increasing the exposed fin ratio can increase the capacitance without increasing the overall area of the device used by the capacitor, and hence, achieve more capacitance density. In embodiments of the present invention, the exposed fin ratio may range from 0.75 to 1.0. An exposed fin ratio of 0.75 means that a majority of the fin is exposed. An exposed fin ratio of 1.0 means that the entire fin is exposed.

Figure 2:
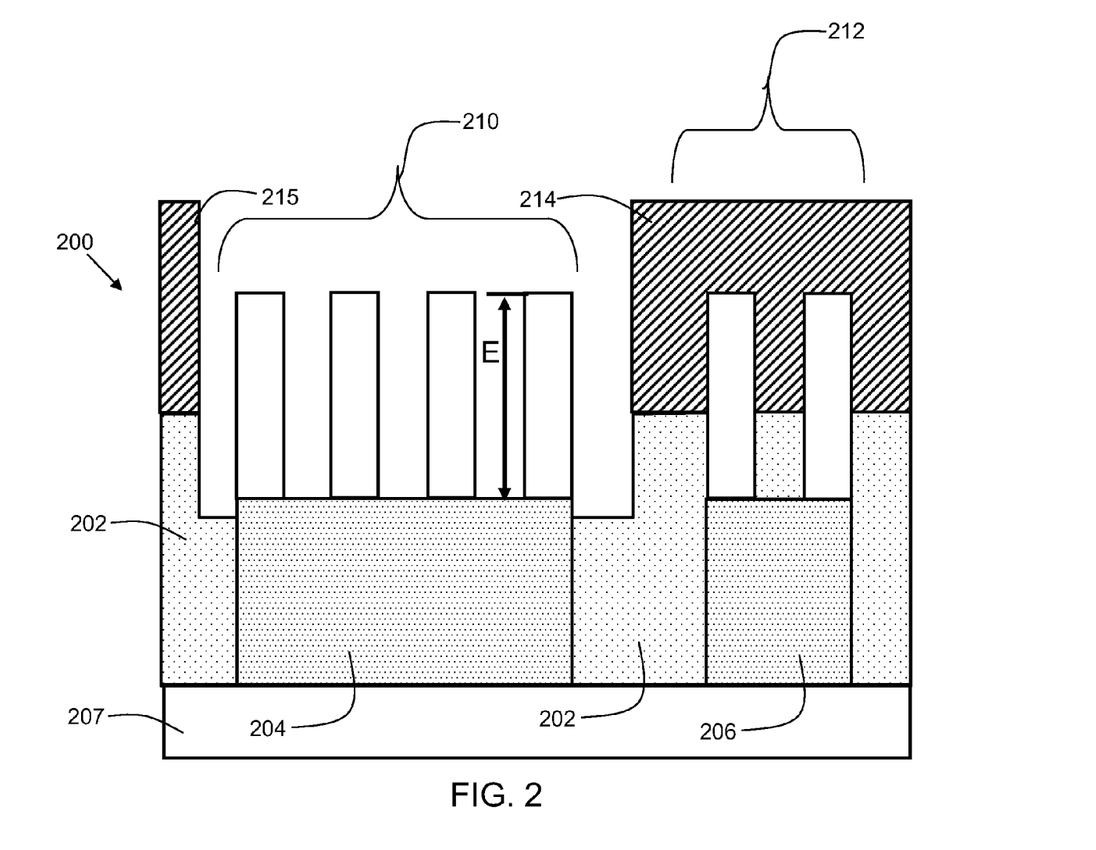
FIG. 2 is a view of a semiconductor structure after subsequent processing steps of patterning.

FIG. 2 is a view of a semiconductor structure 200 after subsequent processing steps of patterning. As stated previously, often, similar elements may be referred to by similar numbers in various figures (FIGs) of the drawing, in which case typically the last two significant digits may be the same, the most significant digit being the number of the drawing figure (FIG). For example, silicon substrate 207 of FIG. 2 is similar to silicon substrate 107 of FIG. 1. Semiconductor structure 200 has mask regions 214 and 215 formed via industry-standard lithographic techniques. Mask region 214 covers the second group of fins 212 used for the finFET. The first group of fins 210 is not covered by mask region 214. A portion of the insulator layer 202 is then removed from the first group of fins such that they are completely exposed, and have an exposed fin ratio of 1.0 (since there is no buried component, the exposed fin ratio is E/(B+E)=1/(0+1)=1.0). The portion of the insulator layer 202 may be removed via a variety of techniques, including, but not limited to, wet etching, or a reactive ion etch (RIE) process.

Figure 3:
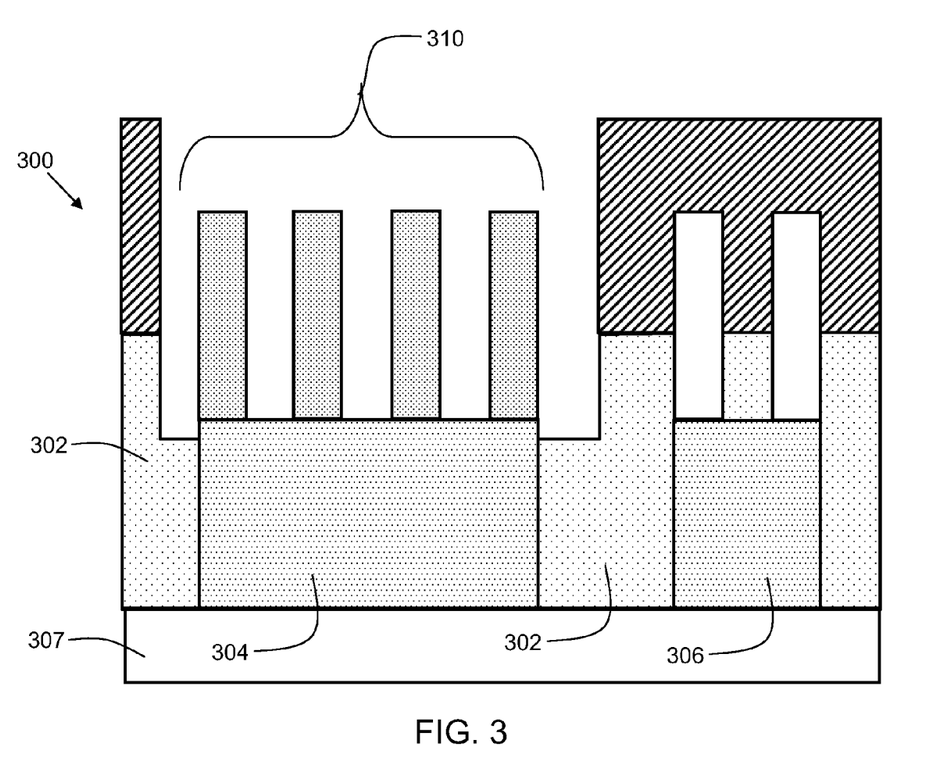
FIG. 3 is a view of a semiconductor structure after subsequent processing steps of doping the capacitor fins.

FIG. 3 is a view of a semiconductor structure after subsequent processing steps of doping the capacitor fins. The fins of the first group of fins 310 are now doped with the same polarity as the first well 304, but the fins are doped with a higher dopant concentration than the well 304. In some embodiments, the dopant concentration of well 304 may range from about 1E17 dopants to about 1E18 dopants, and the first set of fins 310 may have a dopant concentration ranging from about 1E19 atoms per cubic centimeter to about 5E19 atoms per cubic centimeter. The dopant species may include, but is not limited to, arsenic, phosphorous, and boron. The doping may be performed by a variety of techniques, including, but not limited to, ion implantation, diffusion, and in-situ doped epitaxy.

Figure 4:
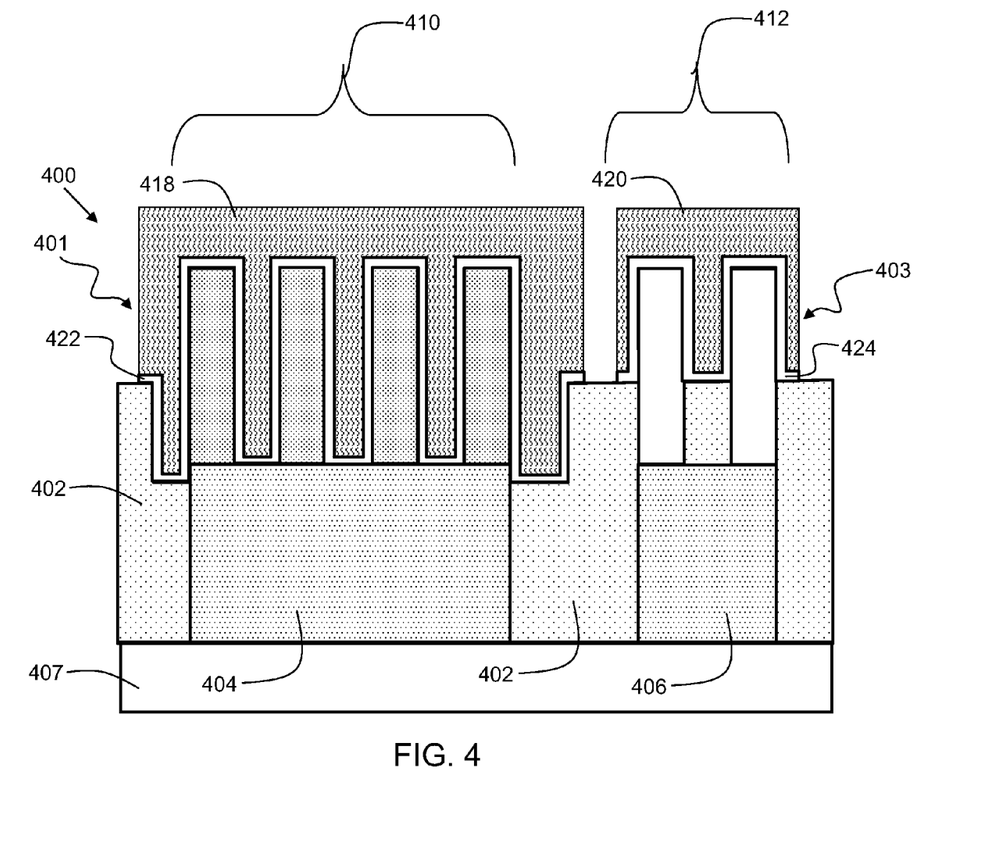
FIG. 4 is a view of a semiconductor structure after subsequent processing steps of dielectric layer and gate formation.

FIG. 4 is a view of a semiconductor structure 400 after subsequent processing steps of dielectric layer and gate formation. The capacitor 401 has a dielectric layer 422 disposed on the first group of fins 410. The finFET 403 has a dielectric layer 424 disposed on the second group of fins 412. The dielectric layers 422 and 424 may be deposited via chemical vapor deposition (CVD), atomic layer deposition (ALD), or other suitable technique. In one embodiment, the dielectric layers 422 and 424 are comprised of the same material. In some embodiments, the dielectric layers 422 and 424 are comprised of hafnium oxide. In some embodiments, the dielectric layers 422 and 424 are comprised of silicon oxide. In some embodiments, the dielectric layers 422 and 424 have a thickness ranging from about 2 nanometers to about 20 nanometers.

The fin capacitor 401 has a gate region 418 disposed on the first group of fins 410. The finFET 403 has a gate region 420 disposed on the second group of fins 412. In some embodiments, the gate regions 418 and 420 may be comprised of polysilicon. In some embodiments, the gate regions 418 and 420 may be comprised of metal, and may be formed via a replacement metal gate (RMG) process. The metals used for gate regions 418 and 420 may include, but are not limited to, titanium, cobalt, and various silicides from those metals. In some embodiments, the gate regions 418 and 420 may be a combination of polysilicon and metal.

Figure 5:
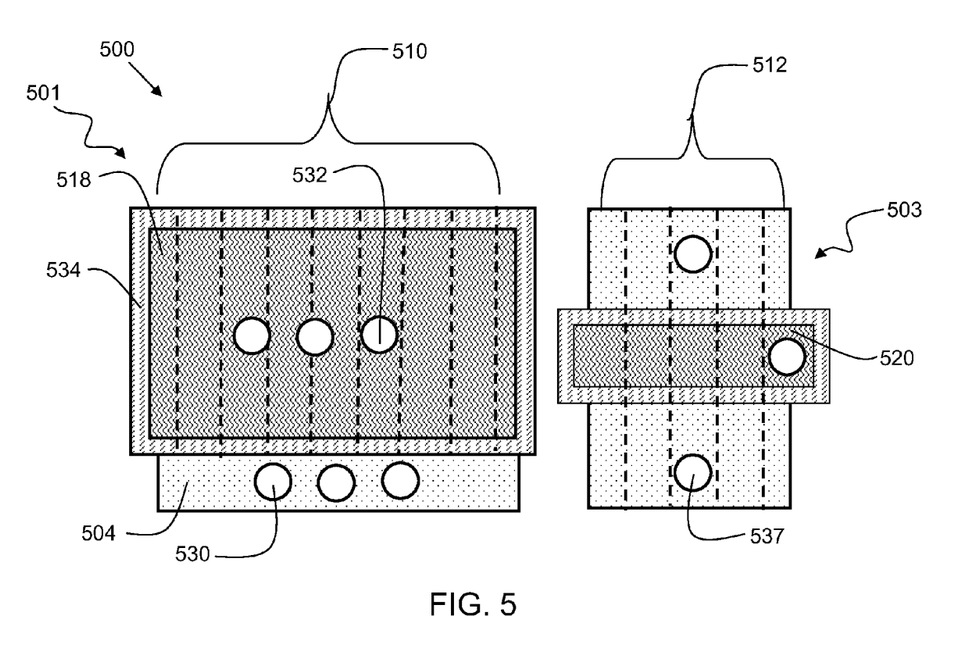
FIG. 5 is a top down view of an embodiment of the present invention.

FIG. 5 is a top down view of a semiconductor structure 500 in accordance with an embodiment of the present invention. Semiconductor structure 500 comprises fin capacitor 501 and finFET 503. The fin capacitor 501 has a plurality of top plate contacts indicated generally as 532, and a plurality of bottom plate contacts, indicated generally as 530. In this embodiment, the bottom plate contacts 530 are contacting the well 504. The first group of fins 510 is substantially covered by the gate region 518. A spacer region 534 may be formed on the outside of gate region 518. The spacer region 534 may be comprised of an insulating material such as an oxide or nitride. Similarly, the finFET 503 has a gate region 520, and has at least three contacts (one for the gate, one for the source, and one for the drain), indicated generally as 537.

Figure 6:
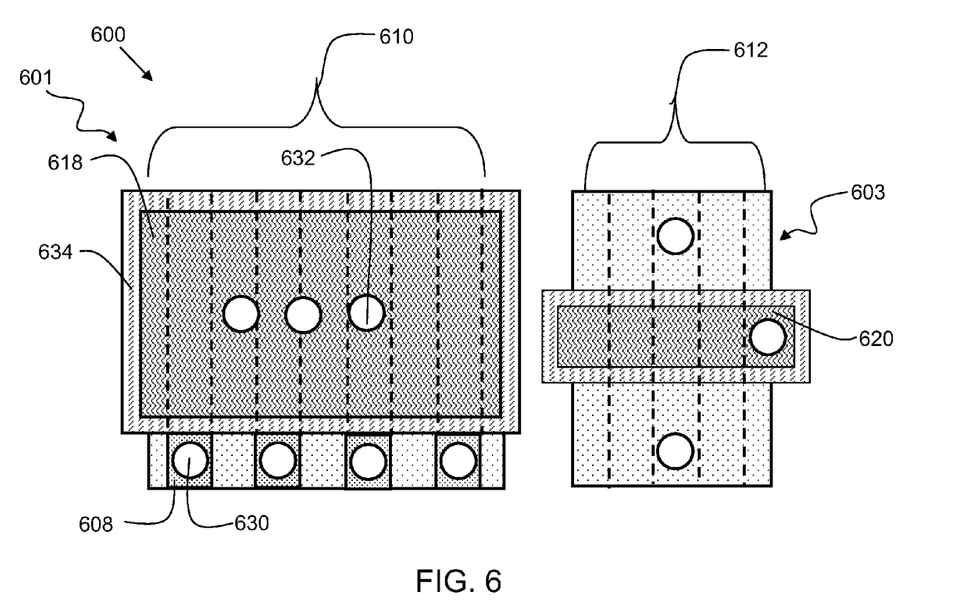
FIG. 6 is a top down view of an alternative embodiment of the present invention.

FIG. 6 is a top down view of a semiconductor structure 600 in accordance with an alternative embodiment of the present invention. With semiconductor structure 600, the first group of fins 610 extends beyond the gate region 618, and the contact 630 is formed on the fin 608. Similarly, other contacts may be formed on some or all of the other fins of group of fins 610.

Figure 7:
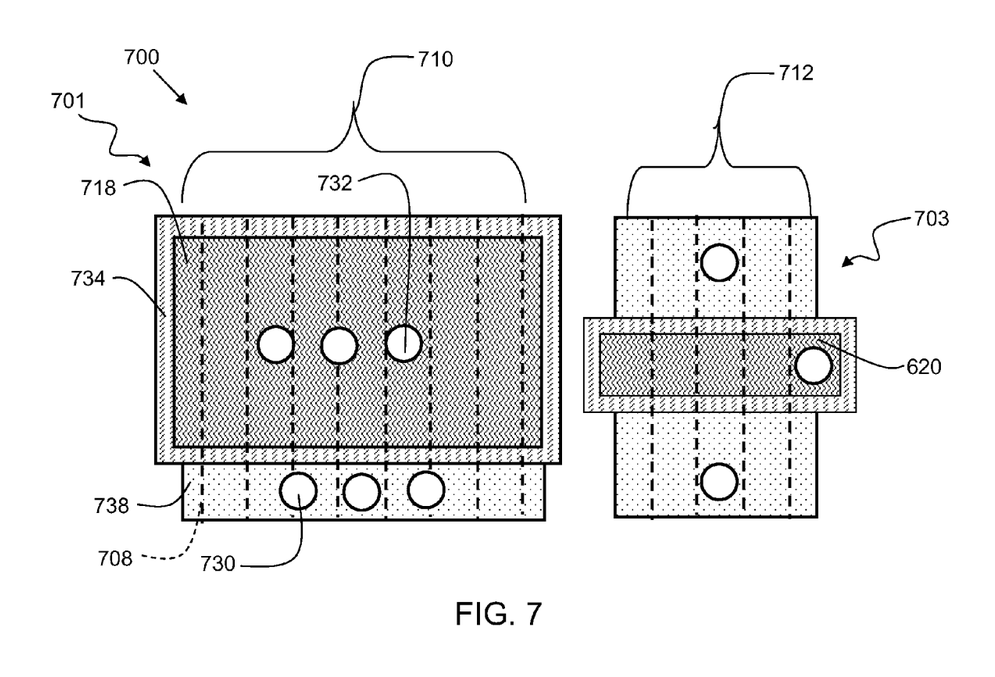
FIG. 7 is a top down view of another alternative embodiment of the present invention.

FIG. 7 is a top down view of a semiconductor structure 700 in accordance with an alternative embodiment of the present invention. With semiconductor structure 700, the contacts 730 of the fin capacitor 701 are formed on a raised-source-drain epitaxy layer (RSD) 738. The RSD epitaxy layer 738 may be formed on the first group of fins 710, as indicated by fin 708.

Figure 8:
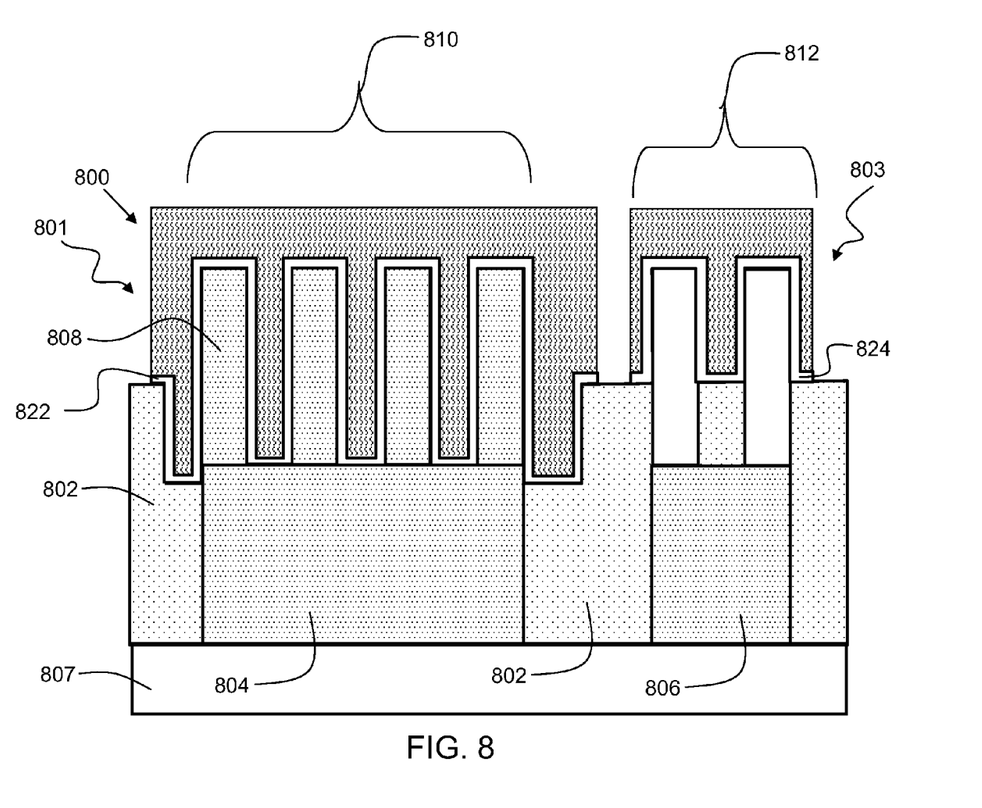
FIG. 8 is a view of an alternative embodiment of the present invention as a depletion-mode varactor.

FIG. 8 is a view of a semiconductor structure 800 in accordance with an alternative embodiment of the present invention as a depletion-mode varactor. In this case, the first group of fins 810 is lightly doped with the same polarity as the first well 804. In this embodiment, both the well 804 and the first group of fins 810 may be doped with a concentration in the range of about 1E17 atoms per cubic centimeter to about 1E18 atoms per cubic centimeter. Both the well 804 and the first group of fins 810 are doped with the same polarity (either N type or P type dopants).

Figure 9:
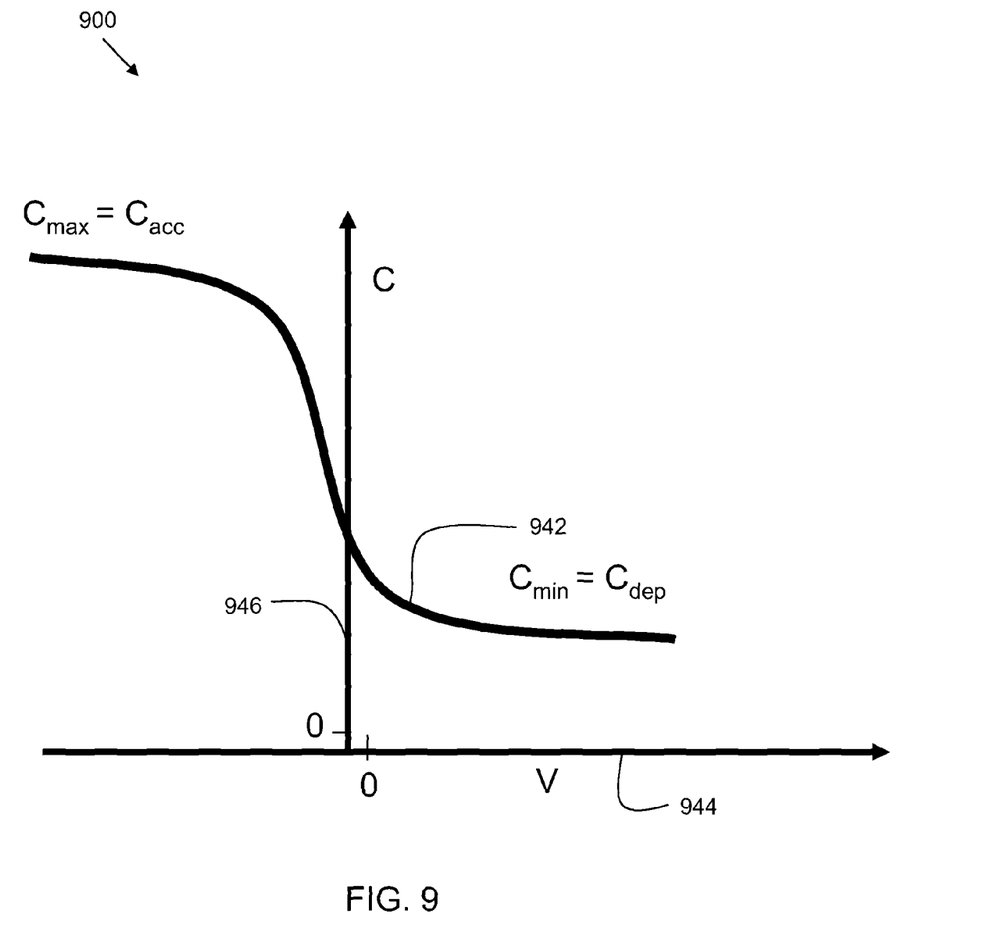
FIG. 9 is a graph showing the relationship of voltage to capacitance for the embodiment of FIG. 8.

FIG. 9 is a graph 900 showing the relationship of voltage to capacitance for the embodiment of FIG. 8. The horizontal axis 944 represents a voltage applied to the capacitor. The vertical axis 946 represents the capacitance of the capacitor. The curve 942 shows the capacitance of the capacitor as a function of the applied voltage. As can be seen in graph 900, the embodiment of FIG. 8 has a minimum capacitance in depletion mode with a positive voltage applied to the capacitor, and a maximum capacitance in accumulation mode with a negative voltage applied to the capacitor. Note that for the sake of simplicity, only the capacitance-voltage characteristic of an n-type capacitor is shown here. For a p-type capacitor the polarity of the voltage is reversed.

Figure 10:
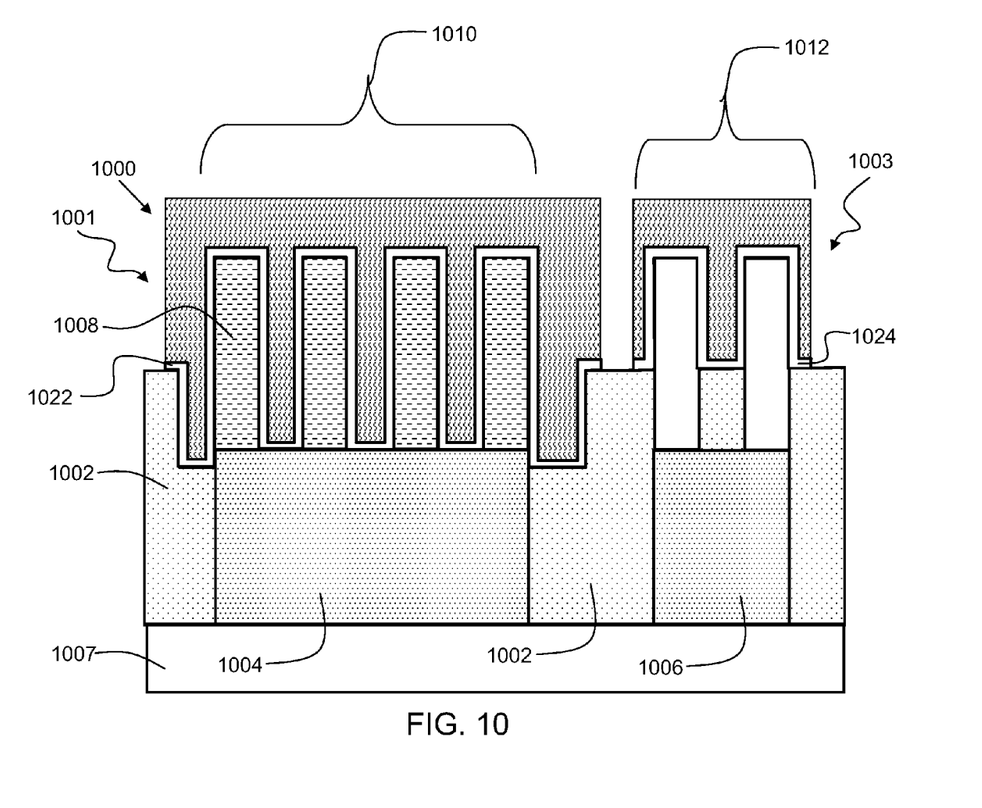
FIG. 10 is a view of an alternative embodiment of the present invention as an inversion-mode varactor.

FIG. 10 is a view of a semiconductor structure 1000 in accordance with an alternative embodiment of the present invention as an inversion-mode varactor. In this case, the first group of fins 1010 is lightly doped with the opposite polarity of the first well 1004. In this embodiment, both the well 1004 and the first group of fins 1010 may be doped with a concentration in the range of about 1E17 atoms per cubic centimeter to about 1E18 atoms per cubic centimeter. The well 1004 and the first group of fins 1010 are doped with the opposite polarity. For example, if the well 1004 is doped with N type dopants, then the first group of fins 1010 is doped with P type dopants. Conversely, if the well 1004 is doped with P type dopants, then the first group of fins 1010 is doped with N type dopants.

Figure 11:
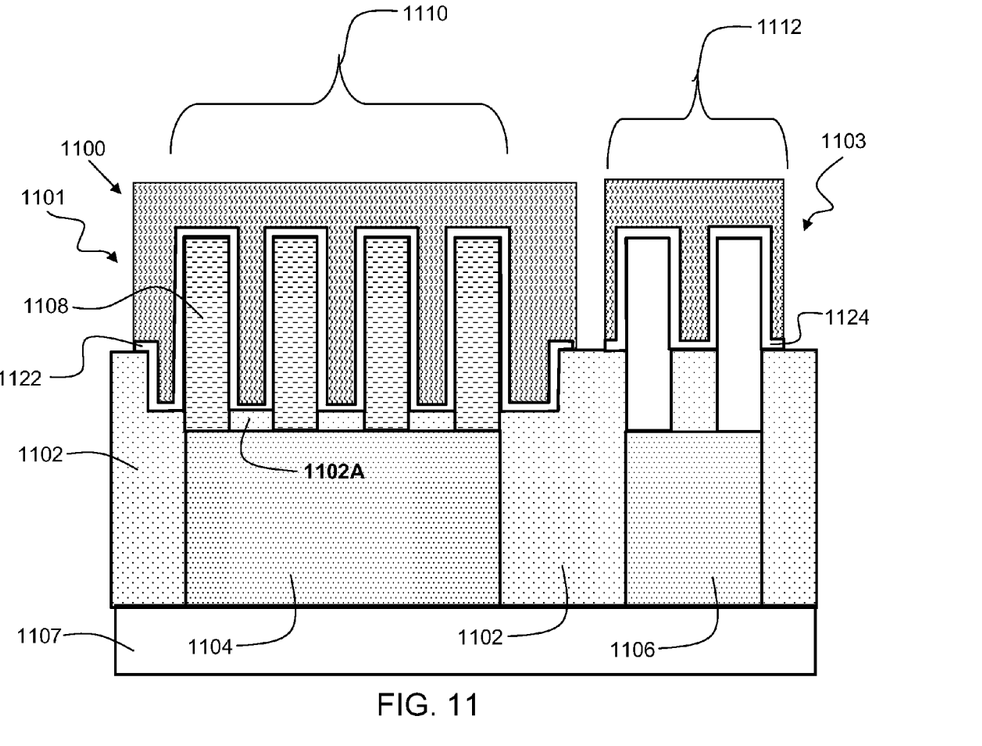
FIG. 11 is a view of an alternative embodiment of the present invention as an inversion-mode varactor an adjusted Cmin value.

FIG. 11 is a view of a semiconductor structure 1100 in accordance with an alternative embodiment of the present invention as an inversion-mode varactor with an adjusted Cmin value. This embodiment is similar to the embodiment of FIG. 10, except that a portion of the insulator layer is intentionally left at the bottom of the first group of fins (see insulator region 1102A). This portion of the insulator layer can be used to reduce the minimum capacitance Cmin of the varactor. Similar to the embodiment of FIG. 10, the first group of fins 1110 is lightly doped with the opposite polarity of the first well 1104. In this embodiment, both the well 1104 and the first group of fins 1110 may be doped with a concentration in the range of about 1E17 atoms per cubic centimeter to about 1E18 atoms per cubic centimeter. The well 1104 and the first group of fins 1110 are doped with the opposite polarity. For example, if the well 1104 is doped with N type dopants, then the first group of fins 1110 is doped with P type dopants. Conversely, if the well 1104 is doped with P type dopants, then the first group of fins 1110 is doped with N type dopants. In one embodiment, the first group of fins may have a total height ranging from about 180 nanometers to about 200 nanometers, and the thickness of the remaining insulator region 1102A may be in the range of about 15 nanometers to about 20 nanometers. In some embodiments, the exposed fin ratio E/(B+E) of the first group of fins 1110 ranges from about 0.75 to about 0.95, whereas the exposed fin ratio for the second group of fins 1112 belonging to finFET 1103 is considerably lower (less than 0.5). Hence, the second set of fins 1112 is embedded deeper into in the insulator layer 1102 than the first set of fins 1110.

Figure 12:
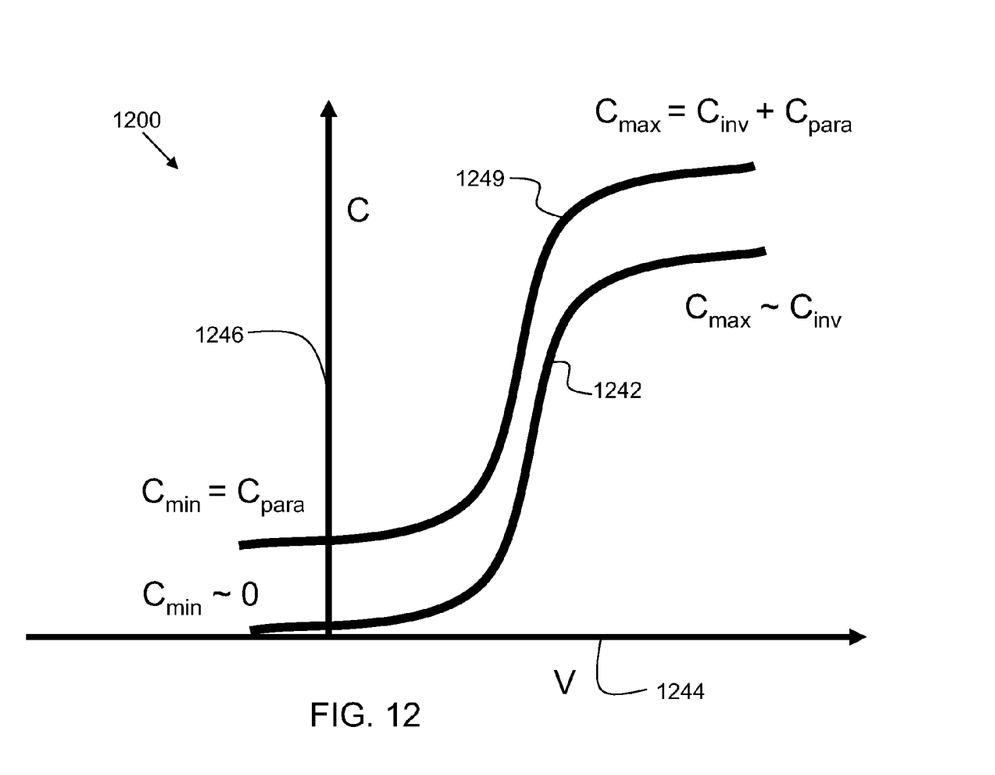
FIG. 12 is a graph showing the relationship of voltage to capacitance for the embodiments of FIG. 10 and FIG. 11.

FIG. 12 is a graph showing the relationship of voltage to capacitance for the embodiments of FIG. 10 and FIG. 11. The horizontal axis 1244 represents a voltage applied to the capacitor. The vertical axis 1246 represents the capacitance of the capacitor. The curve 1249 shows the capacitance of the capacitor of the embodiment of FIG. 10 as a function of the applied voltage. The curve 1242 shows the capacitance of the capacitor of the embodiment of FIG. 11 as a function of the applied voltage. As can be seen in graph 1200, the embodiment of FIG. 11 (curve 1242) has a lower minimum capacitance than that of the embodiment of FIG. 10 (curve 1249).

Figure 13:
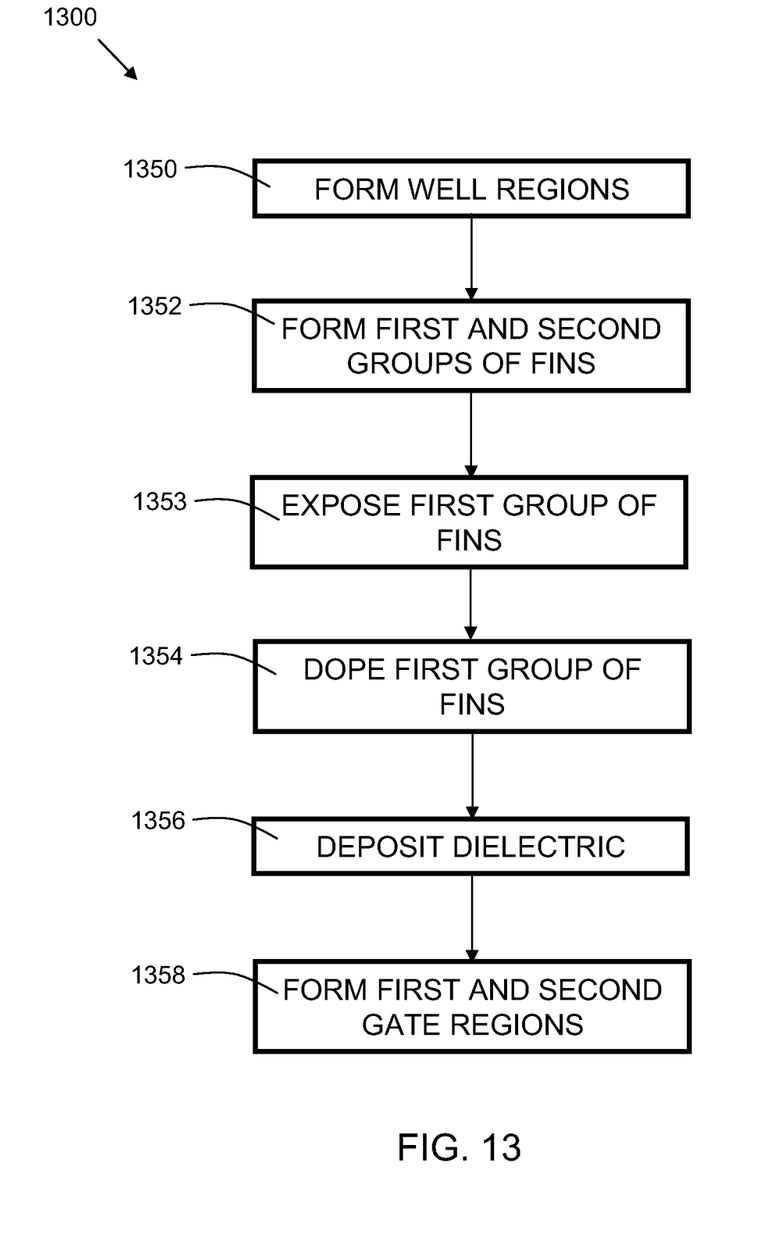
FIG. 13 is a flowchart showing process steps for an embodiment of the present invention.

FIG. 13 is a flowchart 1300 showing process steps for an embodiment of the present invention. In process step 1350, doped wells are formed (see 104 and 106 of FIG. 1). In process step 1352, first and second groups of fins are formed (see 110 and 112 of FIG. 1). The first group of fins is used to form a capacitor and the second group of fins is used to form a finFET. In process step 1353, the first group of fins is exposed (see 210 of FIG. 2). The first group of fins may be exposed via an etch process, which may comprise a wet etch, RIE, or other suitable technique. In process step 1354, the first group of fins is doped (see 310 of FIG. 3). Depending on the type of capacitor to be fabricated (e.g. inversion-mode varactor, depletion mode varactor, etc. . . . ), this step may comprise heavily doping the fins with the same polarity as the first well, lightly doping the fins with the same polarity as the first well, or lightly doping the fins with the opposite polarity of the first well. In process step 1356, a dielectric layer is deposited (see 422 and 424 of FIG. 4). The dielectric may be deposited with chemical vapor deposition (CVD), atomic layer deposition (ALD), or other suitable technique. In process step 1358, first and second gate regions are formed (see 418 and 420 of FIG. 4). The first and second gate regions may be comprised of polysilicon, metal, silicides, or a combination thereof. Note that the order of the steps shown in the flowchart is exemplary, and the order of some steps may be changed without departing from the scope and purpose of embodiments of the present invention.

Figure 14:
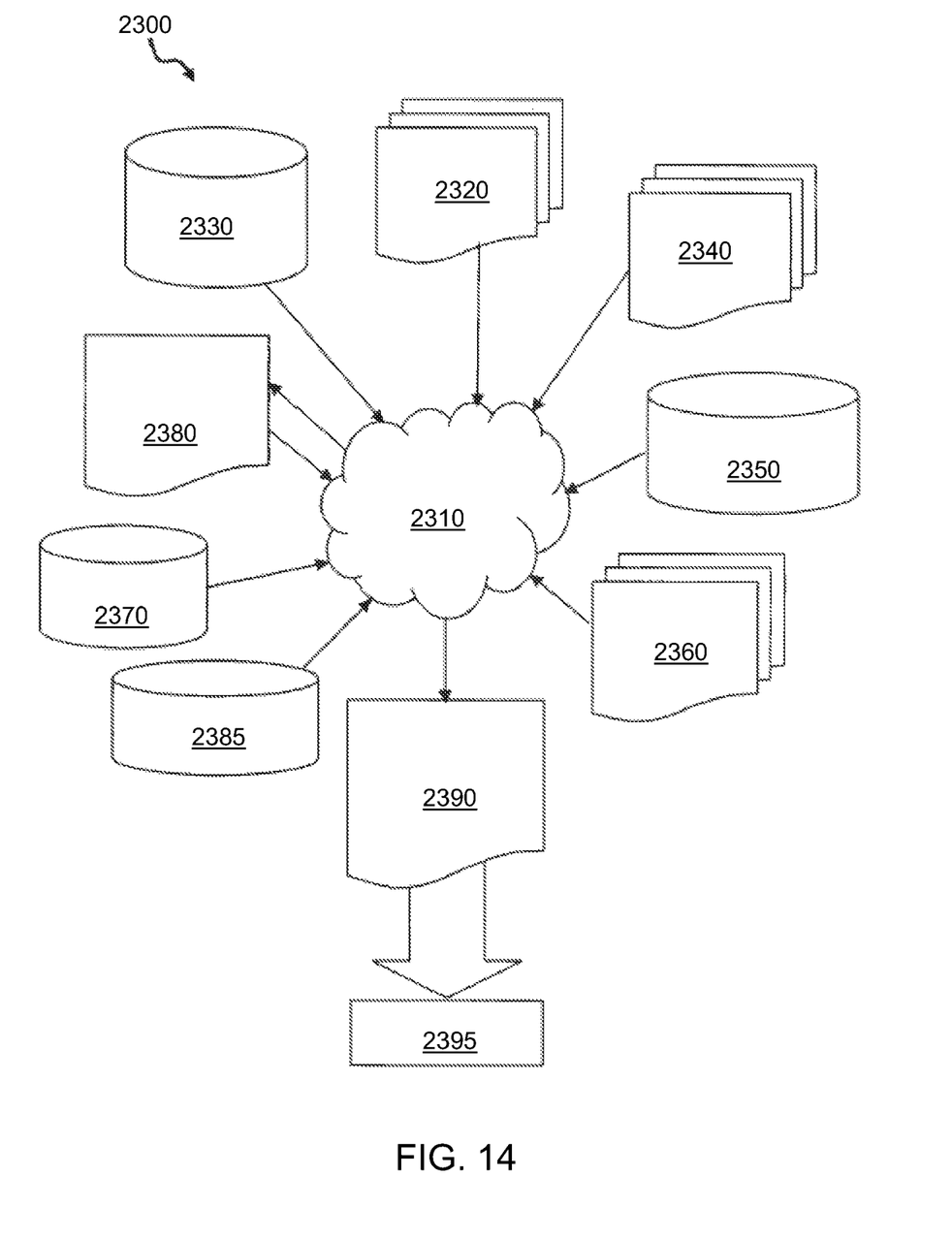
FIG. 14 shows a block diagram of an exemplary design flow.

FIG. 14 shows a block diagram of an exemplary design flow 2300 used for example, in semiconductor IC logic design, simulation, test, layout, and manufacture. Design flow 2300 includes processes, machines and/or mechanisms for processing design structures or devices to generate logically or otherwise functionally equivalent representations of the design structures and/or devices described above and shown in FIGS. 1-13. The design structures processed and/or generated by design flow 2300 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array). The computers may comprise one or more processors that access non-transitory memory which contains instructions for implementing the design process.

Design flow 2300 may vary depending on the type of representation being designed. For example, a design flow 2300 for building an application specific IC (ASIC) may differ from a design flow 2300 for designing a standard component or from a design flow 2300 for instantiating the design into a programmable array, for example a programmable gate array (PGA) or a field programmable gate array (FPGA) offered by Altera® Inc. or Xilinx® Inc.

FIG. 14 illustrates multiple such design structures including an input design structure 2320 that is preferably processed by a design process 2310. Design structure 2320 may be a logical simulation design structure generated and processed by design process 2310 to produce a logically equivalent functional representation of a hardware device. Design structure 2320 may also or alternatively comprise data and/or program instructions that when processed by design process 2310, generate a functional representation of the physical structure of a hardware device. Whether representing functional and/or structural design features, design structure 2320 may be generated using electronic computer-aided design (ECAD) such as implemented by a core developer/designer. When encoded on a machine-readable data transmission, gate array, or storage medium, design structure 2320 may be accessed and processed by one or more hardware and/or software modules within design process 2310 to simulate or otherwise functionally represent an electronic component, circuit, electronic or logic module, apparatus, device, or system such as those shown in FIGS. 1-13. As such, design structure 2320 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 2310 preferably employs and incorporates hardware and/or software modules for synthesizing, translating, or otherwise processing a design/simulation functional equivalent of the components, circuits, devices, or logic structures shown in FIGS. 1-13 to generate a Netlist 2380 which may contain design structures such as design structure 2320. Netlist 2380 may comprise, for example, compiled or otherwise processed data structures representing a list of wires, discrete components, logic gates, control circuits, I/O devices, models, etc. that describes the connections to other elements and circuits in an integrated circuit design. Netlist 2380 may be synthesized using an iterative process in which netlist 2380 is resynthesized one or more times depending on design specifications and parameters for the device. As with other design structure types described herein, netlist 2380 may be recorded on a machine-readable data storage medium or programmed into a programmable gate array. The medium may be a non-transitory, non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 2310 may include using a variety of inputs; for example, inputs from library elements 2330 which may house a set of commonly used elements, circuits, and devices, including models, layouts, and symbolic representations, for a given manufacturing technology (e.g., different technology nodes, 32 nm, 45 nm, 90 nm, etc.), design specifications 2340, characterization data 2350, verification data 2360, design rules 2370, and test data files 2385 (which may include test patterns and other testing information). Design process 2310 may further include, for example, standard circuit design processes such as timing analysis, verification, design rule checking, place and route operations, etc. One of ordinary skill in the art of integrated circuit design can appreciate the extent of possible electronic design automation tools and applications used in design process 2310 without deviating from the scope and spirit of the invention. The design structure of the invention is not limited to any specific design flow.

Design process 2310 preferably translates an embodiment of the invention as shown in FIGS. 1-13, along with any additional integrated circuit design or data (if applicable), into a second design structure 2390. Design structure 2390 resides on a storage medium in a data format used for the exchange of layout data of integrated circuits (e.g. information stored in a GDSII (GDS2), GL1, OASIS, or any other suitable format for storing such design structures). Design structure 2390 may comprise information such as, for example, test data files, design content files, manufacturing data, layout parameters, wires, levels of metal, vias, shapes, data for routing through the manufacturing line, and any other data required by a semiconductor manufacturer to produce an embodiment of the invention as described above with reference to FIGS. 1-13. Design structure 2390 may then proceed to a stage 2395 where, for example, design structure 2390: proceeds to tape-out, is released to manufacturing, is released to a mask house, is sent to another design house, is sent back to the customer, etc.

Although the invention has been shown and described with respect to a certain preferred embodiment or embodiments, certain equivalent alterations and modifications will occur to others skilled in the art upon the reading and understanding of this specification and the annexed drawings. In particular regard to the various functions performed by the above described components (assemblies, devices, circuits, etc.) the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more features of the other embodiments as may be desired and advantageous for any given or particular application.

What is claimed is:

1. A method of making a fin capacitor, comprising:
   forming a first doped well in a semiconductor substrate;
   forming a second doped well in a semiconductor substrate;
   forming a first group of fins on the first doped well;
   forming a second group of fins on the second doped well;
   depositing an insulator layer on the first group of fins and the second group of fins;
   removing a portion of the insulator layer from the first group of fins;
   doping the first group of fins; and
   forming a first gate region of a first depth disposed over an upper portion of the first set of fins; and
   forming a second gate region of a second depth disposed over an upper portion of the second set of fins, wherein the first depth is greater than the second depth.

2. The method of claim 1, wherein doping the first group of fins comprises doping the first group of fins with dopants of the opposite polarity as the first doped well.

3. The method of claim 1, wherein doping the first group of fins comprises doping the first group of fins with dopants of the same polarity as the first doped well.

4. The method of claim 3, wherein doping the first group of fins comprises doping the first group of fins with a dopant concentration ranging from about 1E17 atoms per cubic centimeter to about 1E18 atoms per cubic centimeter.

5. A semiconductor structure comprising;
   a semiconductor substrate;
   a capacitor formed on the semiconductor substrate, the capacitor comprising a first set of fins disposed on a first well disposed within the semiconductor substrate;
   a fin-type field effect transistor formed on the semiconductor substrate adjacent to the capacitor, the fin-type field effect transistor comprising a second set of fins disposed on a second well disposed within the semiconductor substrate;
   an insulator layer disposed on the semiconductor substrate, wherein the second set of fins is partially embedded in the insulator layer and the first set of fins is outside of the insulator layer;
   a first dielectric layer disposed over the first set of fins;
   a second dielectric layer disposed over the second set of fins;
   a first gate region of a first depth disposed over the first set of fins; and
   a second gate region of a second depth disposed over an upper portion of the second set of fins, wherein the first depth is greater than the second depth.

6. The semiconductor structure of claim 5, wherein the first set of fins is doped with a dopant selected from the group consisting of: arsenic, phosphorous, and boron.

7. The semiconductor structure of claim 5, further comprising a plurality of contacts disposed on the first gate region, and a plurality of contacts on the first well.

8. The semiconductor structure of claim 5, further comprising a plurality of contacts disposed on the first gate region, and a plurality of contacts on the first set of fins.

9. The semiconductor structure of claim 5, further comprising:
   a raised-source-drain epitaxy layer disposed on the first group of fins; and
   a plurality of contacts disposed on the raised-source-drain epitaxy layer.

10. The semiconductor structure of claim 5, wherein the first set of fins is doped with the opposite polarity as the first well.

11. The semiconductor structure of claim 10, wherein the first set of fins has a dopant concentration ranging from about 1E17 atoms per cubic centimeter to about 1E18 atoms per cubic centimeter, and the first well has a dopant concentration ranging from about 1E17 atoms per cubic centimeter to about 1E18 atoms per cubic centimeter.

12. The semiconductor structure of claim 5, wherein the first set of fins is doped with the same polarity as the first well.

13. The semiconductor structure of claim 12, wherein the first set of fins has a dopant concentration ranging from about 1E19 atoms per cubic centimeter to about 5E19 atoms per cubic centimeter, and the first well has a dopant concentration ranging from about 1E17 atoms per cubic centimeter to about 1E18 atoms per cubic centimeter.

14. The semiconductor structure of claim 12, wherein the first set of fins has a dopant concentration ranging from about 1E17 atoms per cubic centimeter to about 1E18 atoms per cubic centimeter, and the first well has a dopant concentration ranging from about 1E17 atoms per cubic centimeter to about 1E18 atoms per cubic centimeter.

15. A semiconductor structure comprising;
   a semiconductor substrate;
   a capacitor formed on the semiconductor substrate, the capacitor comprising a first set of fins disposed on a first well disposed within the semiconductor substrate;
   a fin-type field effect transistor formed on the semiconductor substrate adjacent to the capacitor, the fin-type field effect transistor comprising a second set of fins disposed on a second well disposed within the semiconductor substrate;
   an insulator layer disposed on the semiconductor substrate, wherein a lower portion of the first set of fins is buried in the insulator layer at a first depth, and wherein a lower portion of the second set of fins is buried in the insulator layer at a second depth, wherein the second depth is greater than the first depth;
   a first dielectric layer disposed over the first set of fins;
   a second dielectric layer disposed over the second set of fins;
   a first gate region disposed over an upper portion of the first set of fins; and
   a second gate region disposed over an upper portion of the second set of fins.

16. The semiconductor structure of claim 15, wherein the first set of fins is doped with a dopant selected from the group consisting of: arsenic, phosphorous, and boron.

17. The semiconductor structure of claim 15, further comprising a plurality of contacts disposed on the first gate region, and a plurality of contacts on the first set of fins.

18. The semiconductor structure of claim 15, wherein the first set of fins is doped with the opposite polarity as the first well.

19. The semiconductor structure of claim 18, wherein the first set of fins has a dopant concentration ranging from about 1E17 atoms per cubic centimeter to about 1E18 atoms per cubic centimeter, and the first well has a dopant concentration ranging from about 1E17 atoms per cubic centimeter to about 1E18 atoms per cubic centimeter.

20. The semiconductor structure of claim 18, wherein the exposed fin ratio of the first set of fins ranges from about 0.75 to about 0.95.

* * * * *